(12) United States Patent
Nishino et al.

(10) Patent No.: US 8,601,976 B2
(45) Date of Patent: Dec. 10, 2013

(54) GAS SUPPLY SYSTEM FOR SEMICONDUCTOR MANUFACTURING FACILITIES

(75) Inventors: Kouji Nishino, Osaka (JP); Ryousuke Dohi, Osaka (JP); Masaaki Nagase, Osaka (JP); Kaoru Hirata, Osaka (JP); Katsuyuki Sugita, Osaka (JP); Nobukazu Ikeda, Osaka (JP)

(73) Assignee: Fujikin Incorporated, Osaka (JP)

( * ) Notice: Subject to any disclaimer, the term of this patent is extended or adjusted under 35 U.S.C. 154(b) by 914 days.

(21) Appl. No.: 12/680,159

(22) PCT Filed: Jul. 17, 2008

(86) PCT No.: PCT/JP2008/001920
§ 371 (c)(1), (2), (4) Date: Mar. 25, 2010

(87) PCT Pub. No.: WO2009/040973
PCT Pub. Date: Apr. 2, 2009

(65) Prior Publication Data
US 2010/0192854 A1 Aug. 5, 2010

(30) Foreign Application Priority Data
Sep. 25, 2007 (JP) .................. 2007-246558

(51) Int. Cl.
| C23C 16/52 | (2006.01) |
| H01L 21/306 | (2006.01) |
| C23F 1/00 | (2006.01) |
| C23C 16/06 | (2006.01) |
| C23C 16/22 | (2006.01) |

(52) U.S. Cl.
USPC ........... 118/663; 118/695; 118/696; 118/704; 118/715; 156/345.24; 156/345.26

(58) Field of Classification Search
USPC .......................... 118/663, 695, 696, 704, 715; 156/345.24, 345.26
See application file for complete search history.

(56) References Cited

U.S. PATENT DOCUMENTS 4,533,410 A * 8/1985 Ogura et al. .................... 117/99
4,640,221 A * 2/1987 Barbee et al. ................. 118/689
(Continued)

FOREIGN PATENT DOCUMENTS

| JP | 08-288226 | 11/1996 |
| JP | 8-338546 | 12/1996 |

(Continued)

OTHER PUBLICATIONS www.acronymfinder.com/SML website, "What Does SLM Stand for?" SLM Definition by AcronymFinder.

(Continued)

*Primary Examiner* — Rudy Zervigon
(74) *Attorney, Agent, or Firm* — Griffin & Szipl, S.C.

(57) ABSTRACT

A gas supply system includes a main gas supply line; a vent gas supply line; a plurality of gas supply mechanisms disposed in middle of both gas supply lines; a pressure type flow-rate control system disposed on an inlet side of the main gas supply line so a flow of carrier gas is supplied to the main gas supply line; a pressure control system disposed on an inlet side of the vent gas supply line, a carrier gas having a predetermined pressure is supplied to the vent gas supply line while the pressure control system performs a pressure adjustment, a gas pressure of the main gas supply line detected downstream from an orifice of the pressure type flow-rate control system and a gas pressure of the vent gas supply line are compared, and the gas pressure of the vent gas supply line is adjusted so a difference therebetween becomes zero.

4 Claims, 10 Drawing Sheets

(56) References Cited

U.S. PATENT DOCUMENTS

| | | | |
|---|---|---|---|
| 4,747,367 A * | 5/1988 | Posa | 118/715 |
| 4,761,269 A * | 8/1988 | Conger et al. | 118/679 |
| 4,911,101 A * | 3/1990 | Ballingall et al. | 118/715 |
| 5,069,930 A * | 12/1991 | Hussla et al. | 427/588 |
| 5,200,388 A * | 4/1993 | Abe et al. | 505/447 |
| 5,261,961 A * | 11/1993 | Takasu et al. | 118/722 |
| 5,496,408 A * | 3/1996 | Motoda et al. | 118/715 |
| 5,589,110 A * | 12/1996 | Motoda et al. | 261/61 |
| 5,769,950 A * | 6/1998 | Takasu et al. | 118/715 |
| 5,850,853 A * | 12/1998 | Ohmi et al. | 137/606 |
| 5,944,049 A * | 8/1999 | Beyer et al. | 137/487.5 |
| 5,950,675 A * | 9/1999 | Minami et al. | 137/606 |
| 6,007,330 A * | 12/1999 | Gauthier | 432/47 |
| 6,077,718 A * | 6/2000 | Takasu et al. | 438/16 |
| 6,132,515 A * | 10/2000 | Gauthier | 118/715 |
| 6,287,980 B1 | 9/2001 | Hanazaki et al. | 438/726 |
| 6,435,229 B1 * | 8/2002 | Noah et al. | 141/231 |
| 6,645,302 B2 * | 11/2003 | Udagawa | 118/715 |
| 6,782,907 B2 * | 8/2004 | Kawasaki et al. | 137/12 |
| 6,911,092 B2 * | 6/2005 | Sneh | 118/715 |
| 6,938,638 B2 * | 9/2005 | Kubota et al. | 137/240 |
| 7,011,710 B2 * | 3/2006 | Bang et al. | 118/715 |
| 7,169,231 B2 * | 1/2007 | Larson et al. | 118/715 |
| 7,296,532 B2 * | 11/2007 | Cheng et al. | 118/723 MP |
| 7,497,420 B2 * | 3/2009 | Soininen | 261/104 |
| 7,775,236 B2 * | 8/2010 | Gold et al. | 137/487.5 |
| 7,846,497 B2 * | 12/2010 | Gold et al. | 427/248.1 |
| 7,971,861 B2 * | 7/2011 | Soininen | 261/122.1 |
| 8,012,261 B2 * | 9/2011 | Sneh | 118/733 |
| 8,026,159 B2 * | 9/2011 | Horii et al. | 438/500 |
| 8,074,677 B2 * | 12/2011 | Gold et al. | 137/487.5 |
| 8,151,814 B2 * | 4/2012 | Shimizu et al. | 137/14 |
| 8,297,311 B2 * | 10/2012 | Desbiolles et al. | 137/565.23 |
| 8,309,173 B2 * | 11/2012 | Tuominen et al. | 427/255.23 |
| 8,367,566 B2 * | 2/2013 | Sano et al. | 118/695 |
| 2002/0134439 A1 * | 9/2002 | Kawasaki et al. | 137/565.23 |
| 2002/0192369 A1 * | 12/2002 | Morimoto et al. | 427/248.1 |
| 2003/0180458 A1 * | 9/2003 | Sneh | 427/248.1 |
| 2005/0160983 A1 * | 7/2005 | Sneh | 118/715 |
| 2005/0223982 A1 * | 10/2005 | Park et al. | 118/715 |
| 2005/0249876 A1 * | 11/2005 | Kawahara et al. | 427/255.34 |
| 2007/0175392 A1 * | 8/2007 | Znamensky | 118/715 |
| 2009/0064931 A1 * | 3/2009 | Horii et al. | 118/708 |
| 2009/0178694 A1 * | 7/2009 | Okuda et al. | 134/22.12 |
| 2009/0211525 A1 * | 8/2009 | Sarigiannis et al. | 118/707 |
| 2009/0214777 A1 * | 8/2009 | Sarigiannis et al. | 427/248.1 |
| 2009/0214778 A1 * | 8/2009 | Sarigiannis et al. | 427/248.1 |
| 2009/0214779 A1 * | 8/2009 | Sarigiannis et al. | 427/248.1 |
| 2010/0043888 A1 * | 2/2010 | Sneh | 137/14 |
| 2010/0291763 A1 * | 11/2010 | Ogawa et al. | 438/584 |
| 2011/0008955 A1 * | 1/2011 | Horii et al. | 438/608 |
| 2012/0244685 A1 * | 9/2012 | Suzuki et al. | 438/478 |

FOREIGN PATENT DOCUMENTS

| | | |
|---|---|---|
| JP | 9-249500 | 9/1997 |
| JP | 11-212653 A | 8/1999 |
| JP | 2003-195948 A | 7/2003 |
| JP | 2005-223211 | 8/2005 |

OTHER PUBLICATIONS

International Search Report issued in corresponding application No. PCT/JP2008/001920, completed Oct. 7, 2008, mailed Oct. 21, 2008.

* cited by examiner

GAS SUPPLY SYSTEM FOR SEMICONDUCTOR MANUFACTURING FACILITIES

This is a National Phase Application in the United States of International Patent Application No. PCT/JP2008/001920 filed Jul. 17, 2008, which claims priority on Japanese Patent Application No. 2007-246558, filed Sep. 25, 2007. The entire disclosures of the above patent applications are hereby incorporated by reference.

TECHNICAL FIELD OF THE INVENTION

This invention relates to a gas supply system for semiconductor manufacturing facilities that is mainly used as a gas supply system for a metal organic chemical vapor deposition system.

BACKGROUND ART OF THE INVENTION

In a semiconductor having a thin-film-laminated structure produced by a so-called "metal organic chemical vapor deposition method" (hereinafter, referred to simply as an "MOCVD method"), the improvement of sharpness in the interface between thin films of the laminated structure, formed by epitaxial growth, is an indispensable requirement to improve the quality of the semiconductor. In other words, in order to improve sharpness in an interface between thin films, the total amount of gas flow supplied to a reactor is required so as not to be changed even if the kind of source gases is changed, such as by a switching operation from one source gas to another source gas for the vapor-phase growth reaction, and it is necessary to sharply perform the switching operation between the source gases. In other words, in order to improve sharpness in the interface between thin films, it is necessary to maintain a constant total amount of gas flow supply to the reactor even when it is necessary to switch the source of gas flow supplied from one source gas to another source gas.

To do so, first, the amount of gas flow must be controlled with high accuracy and with high responsibility so as not to cause a change in gas pressure within the inside of the reactor, or within the inside of pipes, when switching is performed between source gases. To meet these requirements, many gas supply systems, such as configured in FIG. 10, have been conventionally used in semiconductor manufacturing equipment that adopt the MOCVD method.

Figure 10:
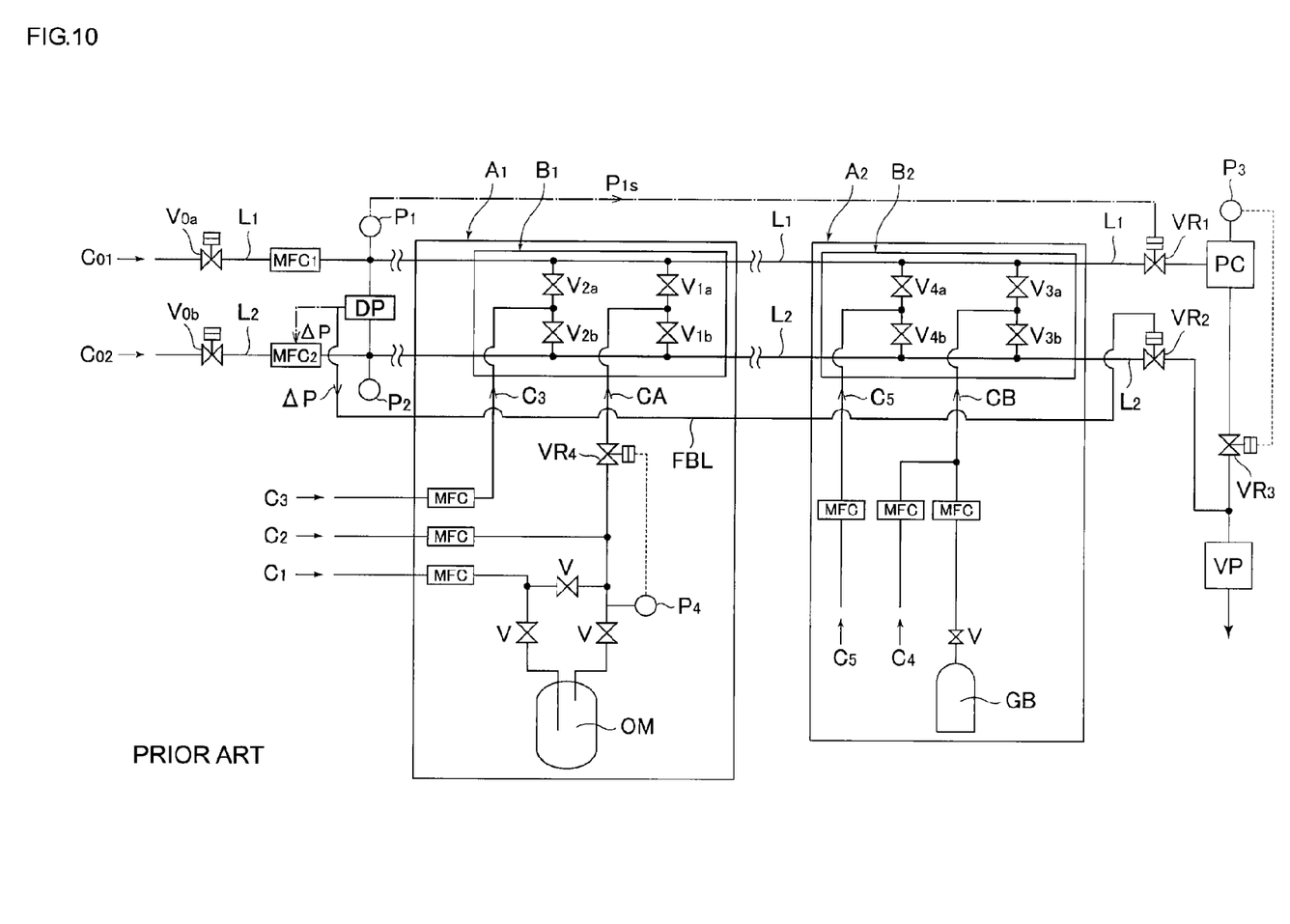
FIG. 10 is an overall system diagram showing an example of a gas supply system for semiconductor manufacture according to the MOCVD method using a conventional mass-flow controller.

In more detail, FIG. 10 shows an example of a basic configuration of a conventional gas supply system that adopts the MOCVD method. In FIG. 10, $L_1$ is a main gas supply line, $L_2$ is a vent gas line, PC is a reactor (process chamber), VP is a vacuum pump, $MFC_1$, $MFC_2$, and MFC are mass-flow controllers, respectively, $P_1$ to $P_4$ are pressure detectors, respectively, $P_{1s}$ is a pressure detection signal, DP is a differential pressure detector, $\Delta P$ is a differential pressure detection signal, $VR_1$, $VR_2$, $VR_3$, and $VR_4$ are pressure regulators, respectively, $V_0$, $V_1$, $V_2$, $V_3$, $V_4$, and V are control valves, respectively, $A_1$ and $A_2$ are gas supply mechanisms, respectively, $B_1$ and $B_2$ are change-over valve mechanisms, respectively, OM is an organometallic liquid, GB is a gas cylinder, $C_0$ to $C_5$ are carrier gases, respectively, and CA and CB are source gases, respectively.

Let it be supposed, hypothetically, that the set value of the amount of flow of the mass-flow controller $MFC_1$ of the main gas supply line $L_1$ and that of the mass-flow controller $MFC_2$ of the vent gas supply line $L_2$ are set at $Q_1$ and $Q_2$, respectively, and the pressure value of the reactor PC are set, and carrier gases $C_{01}$ and $C_{02}$ are allowed to flow to the lines $L_1$ and $L_2$, respectively, at this moment. Furthermore, source gas supply mechanisms $A_1$ and $A_2$ are set and operated, and the amount of flow of the source gas CA and that of the carrier gas $C_3$ are adjusted to have the same value, and the amount of flow of the source gas CB and that of the carrier gas $C_5$ are adjusted to have the same value. Furthermore, valve switching mechanisms $B_1$ and $B_2$ are operated, valves $V_{1a}$ and $V_{2b}$ are opened, valves $V_{1b}$ and $V_{2a}$ are closed, valves $V_{1a}$ and $V_{4b}$ are opened, and valves $V_{3b}$ and $V_{4a}$ are closed in this hypothetical state.

As a result, gas consisting of source gas CA+source gas CB+carrier gas $C_{01}$ (i.e., the amount of flow of these gases is equal to the set value $Q_1$ of the mass-flow controller $MFC_1$) flows through the main gas supply line $L_1$, and is supplied to the reactor PC. On the other hand, the carrier gas consisting of carrier gas $C_5$+carrier gas $C_3$+carrier gas $C_{02}$ (i.e., the total amount of flow of these gases is equal to the set value $Q_2$ of the mass-flow controller $MFC_2$) flows through the vent gas supply line $L_2$, and is evacuated through a vacuum pump VP.

If the supply of the source gas CA is stopped from this hypothetical state described above, and, instead of this gas CA, a source gas CD (not shown) is supplied to the main gas supply line $L_1$ (i.e., the source gas CA is changed to a source gas CD (not shown)) via a change-over valve mechanism $B_3$ (not shown) from another source gas supply mechanisms $A_3$ (not shown), the valve $V_{1a}$ is first closed, the valve $V_{1b}$ is opened, the valve $V_{2b}$ is closed, and the valve $V_{2a}$ is opened.

If a difference in pressure occurs between the gas flowing through the main gas line $L_1$ and the gas flowing through the vent gas supply line $L_2$ when these valves $V_{1a}$, $V_{1b}$, $V_{2b}$, and $V_{2a}$ are switched, a transient response will be caused subsequently in the amount of flow of the source gas CD newly supplied to the main gas line L1, and, as a result, sharpness in the interface between an already-formed thin film and a new thin film, formed by the newly-supplied source gas CD, will deteriorate.

Therefore, to reduce the differential pressure $\Delta P$ between the lines $L_1$ and $L_2$ to zero, the amount of gas flow running through the vent gas supply line $L_2$ is first set at a predetermined value by means of the mass-flow controller $MFC_2$ and, thereafter, the differential pressure $\Delta P$ between the lines $L_1$ and $L_2$ is detected by the differential pressure detector DP and, thereafter, the resulting detection value $\Delta P$ is fed back to a pressure regulator $VR_2$ so that the resistance of the vent gas supply line $L_2$ is adjusted, and the above-mentioned differential pressure $\Delta P$ becomes zero.

According to another or second method, the differential pressure $\Delta P$ detected by the differential pressure detector DP is fed back to the mass-flow controller $MFC_2$ while keeping the set value of the pressure regulator $VR_2$ constant as shown by the alternate long and short dash line of FIG. 10 (i.e., phantom lines), and the amount of gas flow running through the vent gas supply line $L_2$ is thus controlled, and the above-mentioned differential pressure $\Delta P$ can be adjusted to zero. Of course, in the case of this second method, to keep the gas pressure of the inside of the main gas supply line $L_1$ constant, the pressure of the inside of the main gas supply line $L_1$ is detected by a pressure detector $P_1$, as shown by the alternate long and short dash line of FIG. 10 (i.e., phantom lines), and the resulting detection value $P_{1s}$ is fed back to the pressure regulator $VR_1$, so that the resistance of the main gas supply line $L_1$ is adjusted, and, thus, the gas pressure of the main gas supply line $L_1$ is kept constant.

In the gas supply system shown in FIG. 10, the differential pressure $\Delta P$ between the lines $L_1$ and $L_2$ is adjusted to substantially zero when switching is performed between source gases, and, as a result, so-called "sharpness" in an interface forming between an already-formed thin film and a new thin film formed by a source gas, selected by the switching operation, is excellently maintained, and an excellent effect by which a high-quality semiconductor can be obtained is brought about.

However, many problems to be overcome still remain in the gas supply system of FIG. 10. Among these problems, particularly-problematical points are the following two (I) and (II). First point (I): The differential pressure detector DP, a branch pipe used to mount the differential pressure detector DP, the pressure regulators $VR_1$ and $VR_2$, a feedback control line FBL, etc., are needed, in addition to the mass-flow controller $MFC_1$ and the mass-flow controller $MFC_2$, in order to operate the system. Therefore, the equipment and systems are complicated, and a large space is needed to mount the differential pressure detector DP, thus making it difficult to make the gas supply system compact. Second point (II): There is a need to adjust the internal pressure of the vent gas supply line $L_2$ by means of the pressure regulator $VR_2$ based on the differential pressure detection value $\Delta P$ so as to reduce the differential pressure $\Delta P$ to zero (alternatively, there is a need to adjust the internal pressure of the main gas supply line $L_1$ by means of the pressure regulator $VR_1$ based on a differential pressure detection value $\Delta P$ so as to reduce the differential pressure $\Delta P$ to zero), and therefore the responsiveness of pressure control is low.

Patent Literature 1: Japanese Published Patent Application No. 2005-223211.

Patent Literature 2: Japanese Published Patent Application No. H8-288226.

PROBLEMS TO BE SOLVED BY THE INVENTION

The present invention has been made in order to solve the above-mentioned problems of the conventional source gas supply system for MOCVD, wherein the system includes the main gas supply line $L_1$ and the vent gas supply line $L_2$, i.e., which has problems such as (I), the problem wherein the system needs the mass-flow controllers $MFC_1$ and $MFC_2$, the differential pressure detector DP, the pressure regulators $VR_1$ and $VR_2$, the feedback control line FBL, etc., that makes it difficult to make the system structure simple and compact, and (II), the problem wherein system responsiveness with respect to pressure adjustment is low, and, as a result, sharpness in the interface between thin films is decreased when switching is performed between source gases, which deteriorates the quality of semiconductor product. It is therefore a main object of the present invention to provide gas supply equipment that is capable of obtaining a laminated, high-quality semiconductor that is excellent in sharpness in a hetero interface between thin films by using a pressure type flow-rate control system and a pressure control system, both of which are excellent in responsiveness with respect to flow-rate control and in responsiveness with respect to pressure control, instead of using mass-flow controllers $MFC_1$ and $MFC_2$.

MEANS FOR SOLVING THE PROBLEMS STATED ABOVE

Formerly, the present applicant has developed a pressure type flow-rate control system (FCS) as a system to replace the thermal type mass-flow controller (MFC), and has disclosed this system in, for example, Japanese Published Unexamined Patent Application No. H8-338546. This pressure type flow-rate control system is based on the fact that, when a gas flow passing through an orifice is under a so-called "critical state," as described later, the amount Q of gas flow passing through the orifice is expressed as $Q=KP_1$ (where K is a constant, and $P_1$ is the pressure measured on the upstream side from the orifice), and the amount Q of gas flow is proportional to the pressure $P_1$ on the upstream side from the orifice without being influenced by the pressure $P_2$ on the downstream side from the orifice. This pressure type flow-rate control system is characterized as capable of setting, or displaying, (a) all of the flow rate, (b) the amount of flow output, (c) the pressure $P_1$ on the upstream side from the orifice, (d) the pressure $P_2$ on the downstream side from the orifice by means of electric signals (voltage signals), and is characterized by having (e) a high flow/pressure control responsiveness.

The present inventors have conceived that the so-called "sharpness" of an interface between thin films, appearing when switching is performed between source gases, can be improved by using the excellent flow/pressure control response characteristics of the pressure type flow-rate control system (FCS) in a gas supply system of semiconductor manufacturing equipment, according to the MOCVD method, and, based on this idea, have formed a gas supply system used for the MOCVD method. The present inventors have made many examinations regarding control characteristics of the flow rate and pressure exhibited when switching is performed between supply source gases by using this gas supply system.

SUMMARY OF THE INVENTION

The present invention has been made based on the above-mentioned idea and results of flow-rate-and-pressure-control tests of gas supply equipment to which the idea has been applied. According to a first aspect of the present invention, the invention basically provides a gas supply system for semiconductor manufacturing facilities according to a metal organic chemical vapor deposition method, wherein the gas supply system includes: a main gas supply line that supplies a source gas to a reactor; a vent gas supply line that evacuates the source gas; and a plurality of gas supply mechanisms disposed in a middle of both gas supply lines, and the gas supply system is characterized in that a pressure type flow-rate control system is disposed on an inlet side of the main gas supply line, a predetermined amount of flow of a carrier gas is supplied to the main gas supply line while the pressure type flow-rate control system is controlling a flow rate, a pressure control system is disposed on an inlet side of the vent gas supply line, a carrier gas having a predetermined pressure is supplied to the vent gas supply line while the pressure control system is performing a pressure adjustment, a gas pressure $P_{10}$ of the main gas supply line detected downstream from an orifice of the pressure type flow-rate control system and a gas pressure $P_2$ of the vent gas supply line are compared with each other, and the gas pressure $P_2$ of the vent gas supply line is adjusted by the pressure control system so that the difference between the gas pressure $P_{10}$ and the gas pressure $P_2$ becomes zero.

According to a second aspect of the present invention, the gas supply system for semiconductor manufacturing facilities is characterized in that, in the first aspect of the present invention, the pressure type flow-rate control system disposed on the main gas supply line includes: a control valve provided with a valve drive unit; an orifice disposed on a downstream side from the control valve; a pressure detector $P_1$ disposed between the upstream side from the orifice and the control valve; a pressure detector $P_{10}$ disposed on a downstream side from the orifice; and a control circuit unit that calculates a flow rate Q of gas flowing through the orifice based on a pressure signal sent from the pressure detector $P_1$, and that calculates a difference Y between a set flow rate Qs input from an outside and the flow rate Q calculated based thereon, and then inputs the difference Y to the drive unit of the control valve, and that controllably opens or closes the control valve in a direction in which the difference Y becomes zero; and wherein the pressure control system disposed on the vent gas supply line comprises: a control valve provided with a valve drive unit; a pressure detector $P_2$ disposed on a downstream side therefrom; and a control circuit unit to which a detection pressure signal of the pressure detector $P_2$ and a detection pressure signal of the pressure detector $P_{10}$ disposed on a downstream side from the orifice of the pressure type flow-rate control system are input, that calculates a difference between the detection pressure signals and then inputs a signal X corresponding to the difference to the valve drive unit, and that controllably opens or closes the control valve in a direction in which the difference X becomes zero; and a gas pressure of the vent gas supply line is adjusted so that the difference X in pressure between the lines $L_1$ and $L_2$ becomes zero.

According to a third aspect of the present invention, the gas supply system for semiconductor manufacturing facilities is characterized in that, in the first aspect of the present invention, the pressure type flow-rate control system disposed on the main gas supply line is configured so that gas flow passes through the orifice under a critical state.

According to a fourth aspect of the present invention, the gas supply system for semiconductor manufacturing facilities is characterized in that, in the first aspect of the present invention, a detection pressure signal of the pressure detector $P_{10}$ disposed on a downstream side from the orifice of the pressure type flow-rate control system of the main gas supply line is input to the control circuit unit of the pressure control system of the vent gas supply line before performing switching between kinds of gases supplied from any of the gas supply mechanisms, and a difference in pressure between the lines $L_1$ and $L_2$ is adjusted to become zero.

According to a fifth aspect of the present invention, the gas supply system for semiconductor manufacturing facilities is characterized in that, in the first aspect of the present invention, either the pressure control system or the pressure type flow-rate control system is provided with a display mechanism that displays a difference in pressure between the lines $L_1$ and $L_2$.

Thus, in accordance with a first embodiment of the present invention, a gas supply system is provided for semiconductor manufacturing facilities, according to a metal organic chemical vapor deposition method, wherein the gas supply system includes: (a) a main gas supply line that supplies a source gas to a reactor; (b) a vent gas supply line that evacuates the source gas; (c) a plurality of gas supply mechanisms disposed in a middle of both of the gas supply lines; (d) a pressure type flow-rate control system disposed on an inlet side of the main gas supply line; (e) a predetermined amount of flow of a carrier gas is supplied to the main gas supply line while the pressure type flow-rate control system is controlling a flow rate; (f) a pressure control system disposed on an inlet side of the vent gas supply line; (g) a carrier gas having a predetermined pressure supplied to the vent gas supply line while the pressure control system performs a pressure adjustment; a gas pressure $P_{10}$ of the main gas supply line detected downstream from an orifice of the pressure type flow-rate control system and a gas pressure $P_2$ of the vent gas supply line are compared with each other, and the gas pressure $P_2$ of the vent gas supply line is adjusted by the pressure control system so that a difference between the gas pressure $P_{10}$ and the gas pressure $P_2$ becomes zero. In accordance with a second embodiment of the invention, the first embodiment is modified so that the pressure type flow-rate control system disposed on the main gas supply line comprises: i. a control valve provided with a valve drive unit; ii. an orifice disposed on a downstream side from the control valve; iii. a pressure detector $P_1$ disposed between the upstream side from the orifice and the control valve; iv. a pressure detector $P_{10}$ disposed on a downstream side from the orifice; and v. a control circuit unit, wherein the control circuit unit calculates a flow rate Q of a gas flowing through the orifice based on a pressure signal sent from the pressure detector $P_1$, and the control circuit unit calculates a difference Y between a set flow rate Qs input from an outside and the flow rate Q calculated based thereon, and then inputs the difference Y to the drive unit of the control valve, and the control circuit unit controllably opens or closes the control valve in a direction in which the difference Y becomes zero; and the gas supply system is further characterized in that the pressure control system disposed on the vent gas supply line comprises: i. a control valve provided with a valve drive unit; ii. a pressure detector $P_2$ disposed on a downstream side therefrom; and iii. a control circuit unit to which a detection pressure signal of the pressure detector $P_2$ and a detection pressure signal of the pressure detector $P_{10}$ disposed on a downstream side from the orifice of the pressure type flow-rate control system are input, and the control circuit unit calculates a difference between the detection pressure signals and then inputs a signal X corresponding to the difference to the valve drive unit, and the control circuit unit controllably opens or closes the control valve in a direction in which the difference X becomes zero; and wherein a gas pressure of the vent gas supply line is adjusted so that the difference X in pressure between the lines $L_1$ and $L_2$ becomes zero.

In accordance with a third embodiment of the invention, the first embodiment is modified so that the pressure type flow-rate control system disposed on the main gas supply line is configured so that the gas flow passes through the orifice under a critical state. In accordance with a fourth embodiment of the present invention, the first embodiment is modified so that a detection pressure signal of the pressure detector $P_{10}$ disposed downstream from the orifice of the pressure type flow-rate control system of the main gas supply line is input to the control circuit unit of the pressure control system of the vent gas supply line before performing switching between kinds of gases supplied from any of the gas supply mechanisms, and a difference in pressure between the lines $L_1$ and $L_2$ is adjusted to become zero. In accordance with a fifth embodiment of the invention, the first embodiment is modified so that either the pressure control system, or the pressure type flow-rate control system, is provided with a display mechanism that displays a difference in pressure between the lines $L_1$ and $L_2$.

EFFECTS OF THE INVENTION

In accordance with the present invention, the flow rate control of the main gas supply line $L_1$ and the pressure control of the vent gas supply line $L_2$ are performed using the pressure type flow-rate control system and the pressure control system having a configuration similar to this flow-rate control system, and, therefore, a difference in pressure between the gas supply lines $L_1$ and $L_2$ can be instantaneously adjusted and kept at zero by effectively using a high responsiveness inherent to the pressure type flow-rate control system and the pressure control system. As a result, the occurrence of a difference in pressure between both lines $L_1$ and $L_2$ is never caused when switching between source supply gases is performed, and, therefore, a transient flow phenomenon does not occur when a new source gas is supplied, and a so-called decrease in sharpness of the interface between thin films is prevented, and, as a result, a high-quality semiconductor product can be obtained.

Additionally, a pressure detector and a calculation control unit, which are components of the pressure type flow-rate control system and of the pressure control system, can be used completely and without being modified, and, unlike the conventional system, both of the lines $L_1$ and $L_2$ are not required to have a pressure regulator or a feedback control line FBL. Therefore, the equipment can be reduced in size and cost.

DETAILED DESCRIPTION OF THE INVENTION AND DESCRIPTION OF REFERENCE NUMERALS $L_1$ is a main gas supply line, $L_2$ is a vent gas supply line, PC is a reactor (process chamber), VP is a vacuum pump, $MFC_1$ is a mass-flow controller of the main gas supply line, $MFC_2$ is a mass-flow controller of the vent gas supply line, $Q_1$ and $Q_2$ are flow rate set values of the mass-flow controllers $MFC_1$ and $MFC_2$, respectively, MFC is a mass-flow controller, $P_1$ to $P_4$ are pressure detectors and pressure detection signals, respectively, DP is a differential pressure detector, $\Delta P$ is a detection signal of the differential pressure detector DP, $VR_1$ to $VR_4$ are pressure regulators, respectively, $V_0$ to $V_4$ are change-over valves, respectively, $A_1$ and $A_2$ are gas supply mechanisms, respectively, $B_1$ and $B_2$ are change-over valve mechanisms, respectively, OM is an organometallic liquid (source gas), GB is a source gas cylinder, $C_{01}$ and $C_{02}$ are carrier gases supplied to the lines $L_1$ and $L_2$, respectively, $C_1$ to $C_5$ are carrier gases, respectively, CA and CB are source gases, respectively, $L_1$ is a main gas supply line, $L_2$ is a vent gas supply line, FBL is a feedback control line, FCS-N is a pressure type flow-rate control system, FCS-RV is a pressure control system, Ps is a pressure set from the outside, Qs is a setting input from the outside, $P_0$ is a pressure output signal to the outside, $Q_0$ is a flow-rate output signal to the outside, $D_1$ and $D_2$ are valve drive devices, respectively, $VC_1$ and $VC_2$ are control valves, respectively, OL is an orifice, $P_1$ is a gas pressure of the main gas supply line $L_1$ on the upstream side from the orifice, $P_{10}$ is a gas pressure of the main gas supply line $L_1$ on the downstream side from the orifice, $P_2$ is a gas pressure of the vent gas supply line $L_2$, 10 and 11 are control circuit units, respectively, 12 is a carrier gas supply source, RG is a pressure regulator, PT is a pressure gauge, and $NV_1$ and $NV_2$ are pressure regulating valves, respectively.

BEST MODE FOR CARRYING OUT THE INVENTION

Figure 1:
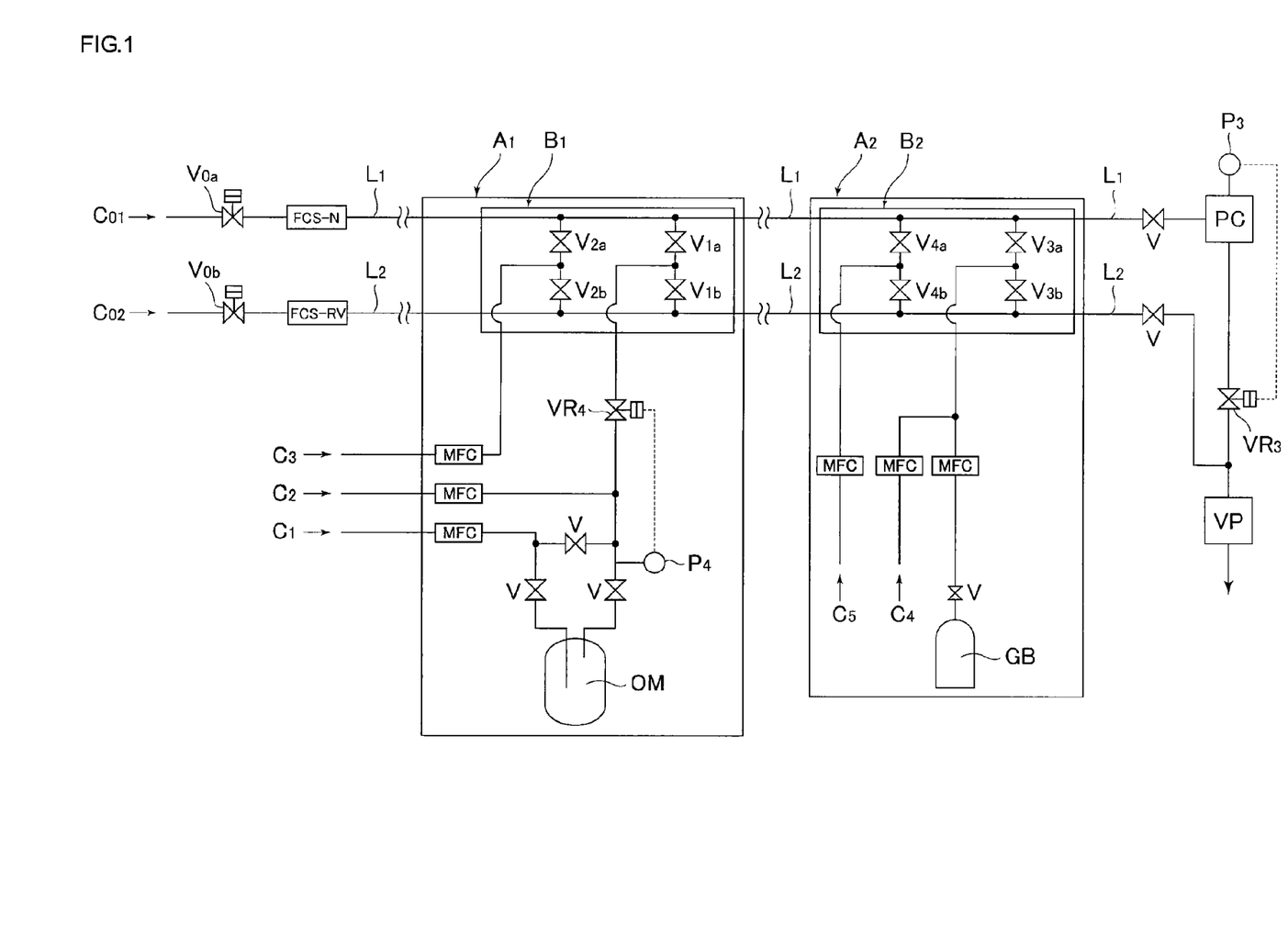
FIG. 1 is an overall system diagram of a source gas supply system for semiconductor manufacture according to the present invention.

An embodiment of the present invention will be hereinafter described with reference to the drawings. FIG. 1 shows an embodiment of a gas supply system for semiconductor manufacturing facilities according to the present invention. In FIG. 1, FCS-N designates a pressure type flow-rate control system, FCS-RV designates a pressure control system, $A_1$ designates a mechanism for supplying an organometallic source gas, $A_2$ designates a mechanism for supplying another source gas, $L_1$ designates a main gas supply line, and $L_2$ designates a vent gas supply line. The other configuration members are the same as those of the conventional gas supply system shown in FIG. 10 and, therefore, a description of the same members is omitted here and the same reference characters are used to designate like parts.

In other words, the present invention differs from the conventional gas supply equipment mainly in the fact that, in the present invention, the mass-flow controllers $MFC_1$ and $MFC_2$, the differential pressure detector $\Delta P$, the pressure regulators $VR_1$ and $VR_2$, the feedback control line FBL of a differential pressure signal $\Delta P$, the feedback control line FBL of a pressure detection signal $P_{1s}$, etc., of the conventional gas supply equipment are removed, and, instead of these members, a pressure type flow-rate control system FCS-N and a pressure control system FCS-RV are used.

Figure 2:
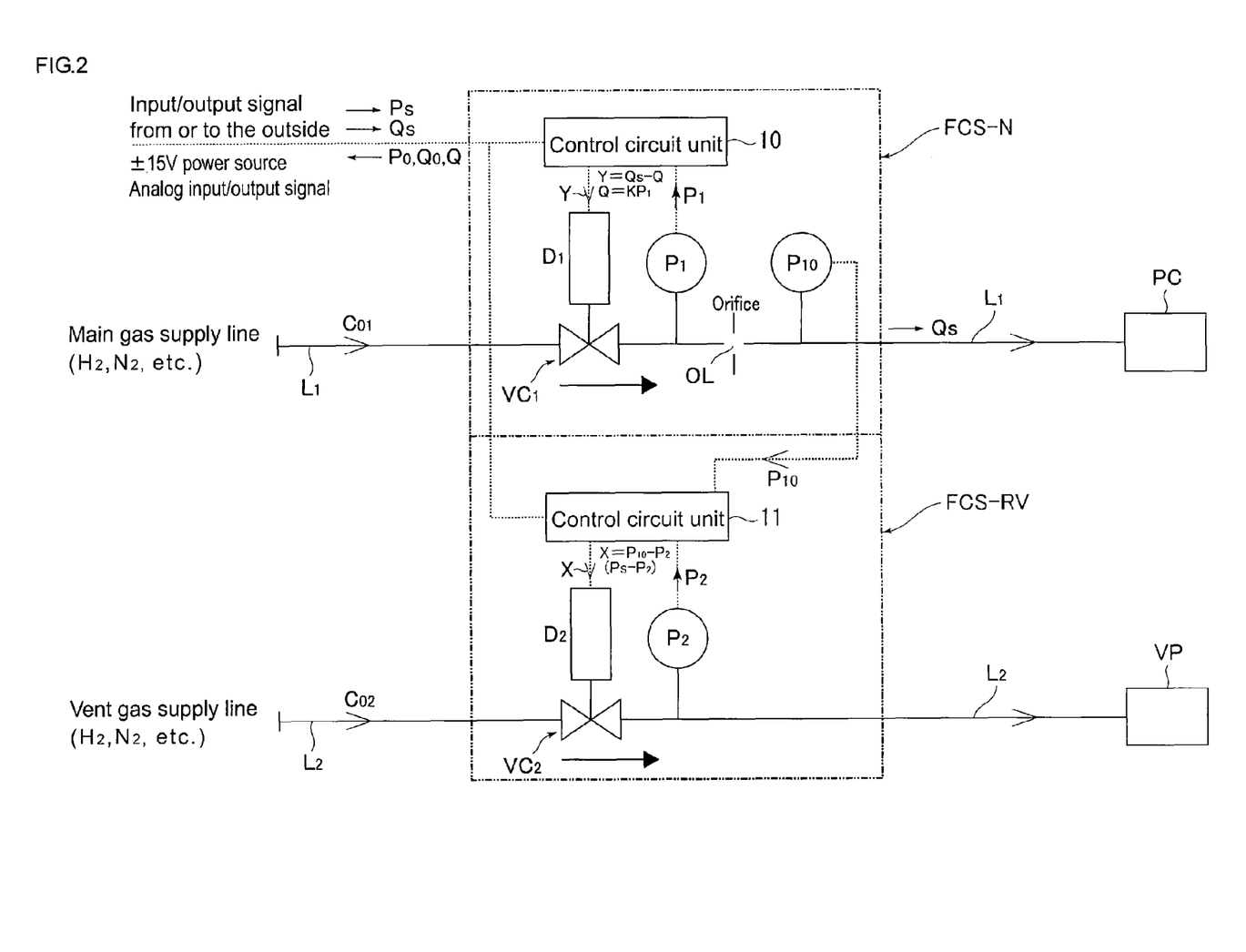
FIG. 2 is a detailed explanatory view of the configuration of a differential pressure regulating unit of the gas supply system shown in FIG. 1.

FIG. 2 shows a detailed configuration of the pressure type flow-rate control system FCS-N, and a detailed configuration of the pressure control system FCS-RV, of FIG. 1. The pressure type flow-rate control system FCS-N is composed of a control valve $VC_1$, a valve drive unit $D_1$, an orifice OL, a pressure detector $P_1$ disposed upstream from the orifice OL, a pressure detector $P_{10}$ disposed downstream from the orifice OL, and a control circuit unit 10. The pressure control system FCS-RV is composed of a control valve $VC_2$, a valve drive unit $D_2$, a pressure detector $P_2$ disposed downstream from the control valve $VC_2$, and a control circuit unit 11.

In the pressure type flow-rate control system FCS-N, the amount Q of gas flow passing through the orifice in the control circuit unit 10 is calculated according to the equation $Q=KP_1$ (where K is a constant depending on the orifice, etc., and $P_1$ is a detection pressure detected by the pressure detector P1). Furthermore, a set amount Qs of gas flow that is input from the outside and the value Q obtained by the calculation are compared with each other in the control circuit unit 10, and a control signal Y is then supplied to the valve drive unit $D_1$, and the degree of openness of the control valve $VC_1$ is controlled so that a difference Y ($=Q_s-Q$) therebetween becomes zero.

Likewise, in the pressure control system (FCS-RV), a detection value $P_{10}$ detected by the pressure detector $P_{10}$ of the main gas supply line $L_1$ and a detection value $P_2$ detected by the detector $P_2$ of the vent gas supply line $L_2$ are compared with each other in the control circuit unit 11, and a control signal X is sent to the drive unit $D_2$ of the control valve $VC_2$, and the degree of openness of the control valve $VC_2$ is controlled so that a difference X ($=P_{10}-P_2$) therebetween becomes zero. A pressure Ps that is set on the outside (i.e., that is set externally) can also be input to the pressure control system FCS-RV, and, in this case, the degree of opening of the control valve $VC_2$ is controlled so that a difference ($P_s-P_2$) becomes zero. If the set pressure Ps is set at a value differing from the value $P_{10}$, then the input $P_{10}$ from the pressure detector $P_{10}$ will be blocked.

According to the source gas supply system of the present invention, the amount $Q_1$ of gas flow running through the main gas supply line $L_1$ is set at a predetermined flow rate, and thereby a necessary source gas having the flow rate $Q_1$ is supplied to the reactor PC through the line $L_1$ under a constant pressure $P_{10}$ ($Q_s=Q_1$). On the other hand, in the vent gas supply line $L_2$, a vent gas flows via the vent gas supply line $L_2$ under a predetermined pressure $P_2$, and a pressure detection value $P_{10}$ of the main gas supply line $L_1$ is input to the control circuit unit 11, and, as a result, the pressure $P_2$ of the vent gas supply line $L_2$ is instantaneously adjusted by controllably opening or closing the control valve $VC_2$ so that a difference therebetween automatically becomes zero ($P_{10}-P_2=0$). In other words, an adjustment is made so that the difference in pressure between the lines $L_1$ and $L_2$ instantaneously becomes zero.

Normally, the source gas supply system is operated in the state of keeping the difference in pressure between the lines $L_1$ and $L_2$ at zero by inputting the pressure detection value $P_{10}$ of the main gas supply line $L_1$ to the control circuit unit 11 of the vent gas supply line $L_2$, although the pressure $P_2$ of the vent gas supply line $L_2$ can, of course, be automatically controlled to reach the pressure Ps set from the outside (i.e., set externally) by blocking the input of the detection pressure $P_{10}$ of the main gas supply line.

The response characteristics of the pressure type flow-rate control system FCS-N and the pressure control system FCS-RV used in the present invention are extremely excellent, and, as is apparent from experimental results described later, the difference in pressure between the gas lines $L_1$ and $L_2$ is hardly caused, i.e., in other words, the difference in pressure between the lines $L_1$ and $L_2$ is adjusted to zero with higher responsiveness even when the change-over valve mechanism B is actuated when the switching operation is performed between source gases.

Figure 3:
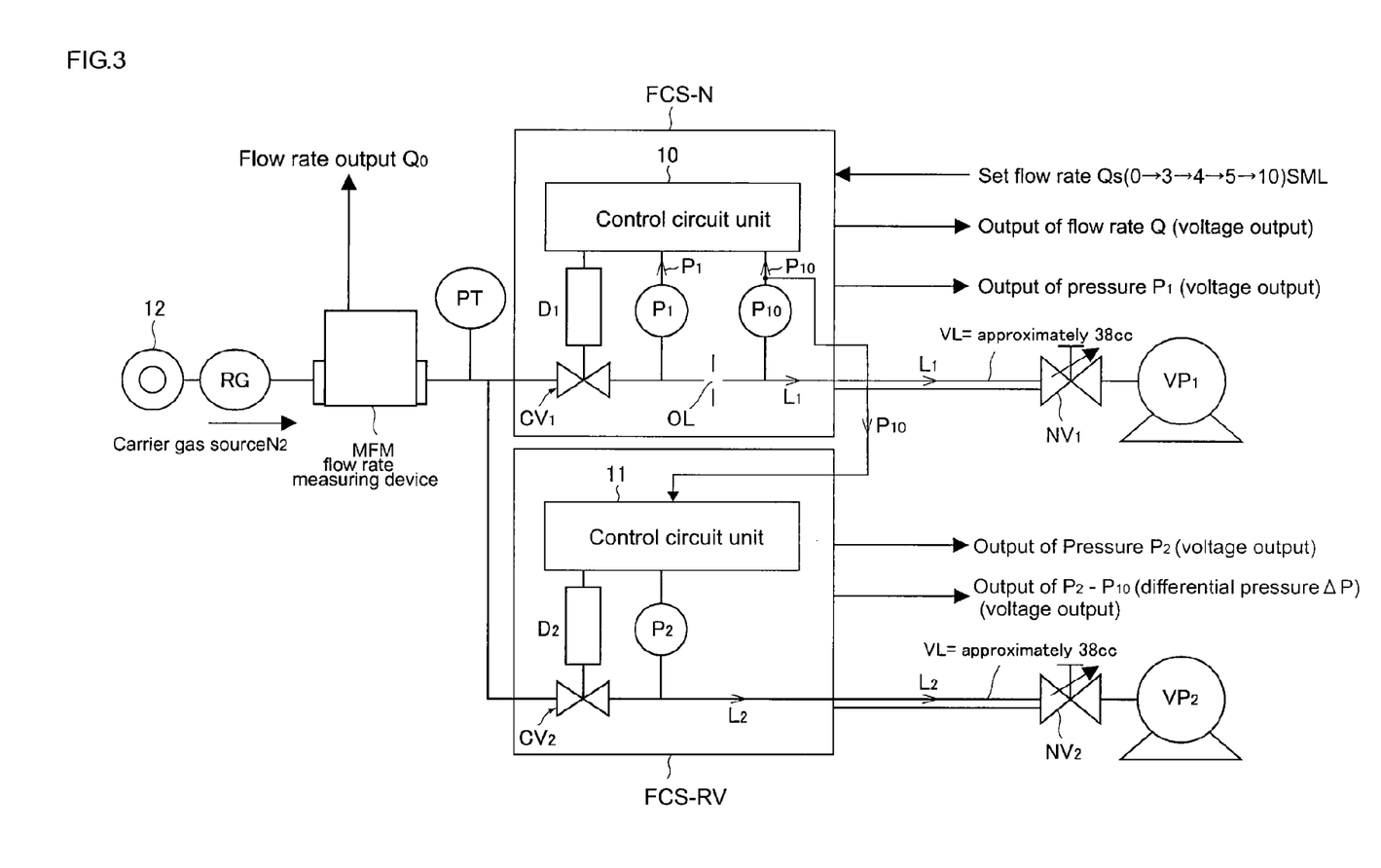
FIG. 3 is an overall system diagram of a testing device used to confirm actuation.

FIG. 3 is an overall system diagram of a testing device of a differential pressure regulating mechanism used to confirm the situation of the occurrence of a difference in pressure between the gas lines $L_1$ and $L_2$ when switching is performed between source gases in the source gas supply system, according to the present invention.

In FIG. 3, 12 designates a carrier gas source ($N_2$), RG designates a pressure regulator, PT designates a pressure gauge (250 KPas), and the seat diameter of each of the control valve $VC_1$ and the control valve $VC_2$ is 6 mmφ. The volume on the downstream side of each of the main gas supply line $L_1$ and the vent gas supply line $L_2$ is about 38 cc. $NV_1$ and $NV_2$ designate pressure regulating valves, respectively, and $VP_1$ and $VP_2$ designate evacuation pumps, respectively.

The evacuation pump $VP_1$ can adjust the exhaust pressure to 75 Torr, 100 Torr, and 125 Torr when the flow rate Q is equal to 4 SLM (Q=4 SLM) (in terms of $H_2$), and the evacuation pump $VP_2$ used here can adjust the exhaust flow rate to 3 SLM, 4 SLM, and 5 SLM when the pressure is 100 Torr. In this application, SLM pertains to standard liters per minute. The flow rate setting input of the pressure type flow-rate control system FCS-N was set at 0 SLM, 3 SLM, 4 SLM, 5 SLM, and 10 SLM (in terms of $H_2$).

Experimental Result 1

Figure 4:
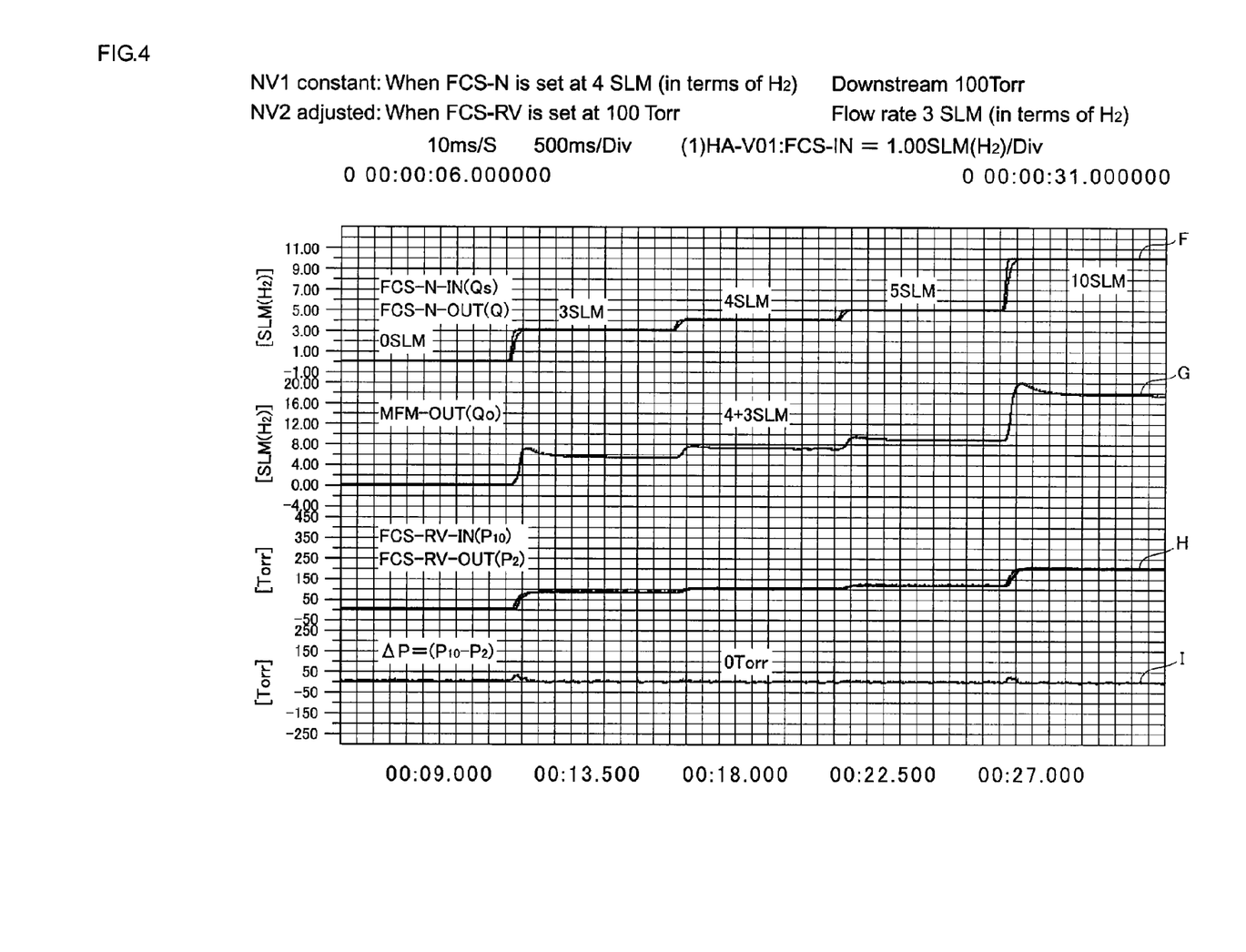
FIG. 4 is a diagram showing an example of the result of differential pressure regulation tests of the source gas supply system according to the present invention.

First, the pressure regulating valve $NV_1$ of the main gas supply line $L_1$ was set to be constant, and the pressure type flow-rate control system FCS-N was set at 4 SLM, and the exhaust pressure of the evacuation pump $VP_1$ was set at 100 Torr. Additionally, the pressure regulating valve $NV_2$ of the vent gas supply line $L_2$ was adjusted, and the pressure control system FCS-RV was set at 100 Torr, and the exhaust flow rate of the evacuation pump $VP_2$ was set at 3 SLM (in terms of $H_2$). When the flow rate set value Qs of the main gas supply line $L_1$ was changed in order of 0 SLM, 3 SLM, 4 SLM, 5 SLM, and 10 SLM from the above-mentioned state, the set flow rate Qs of the pressure type flow-rate control system FCS-N and the change in flow output Q (curve F of FIG. 4), the flow output $Q_0$ of a flow measuring device MFM (curve G of FIG. 4), the pressure output $P_2$ of the pressure control system FCS-RV (curve H of FIG. 4), and the difference $\Delta P=P_{10}-P_2$ in pressure between the lines $L_1$ and $L_2$ (curve I of FIG. 4) were measured. FIG. 4 shows these results. It is understood that the differential pressure $\Delta P$ is almost zero (i.e., substantially zero). One graduation of the horizontal axis of FIG. 4 indicates 500 ms. Curve F and curve H are shown in the state in which two kinds of data substantially coincide with each other.

Figure 5:
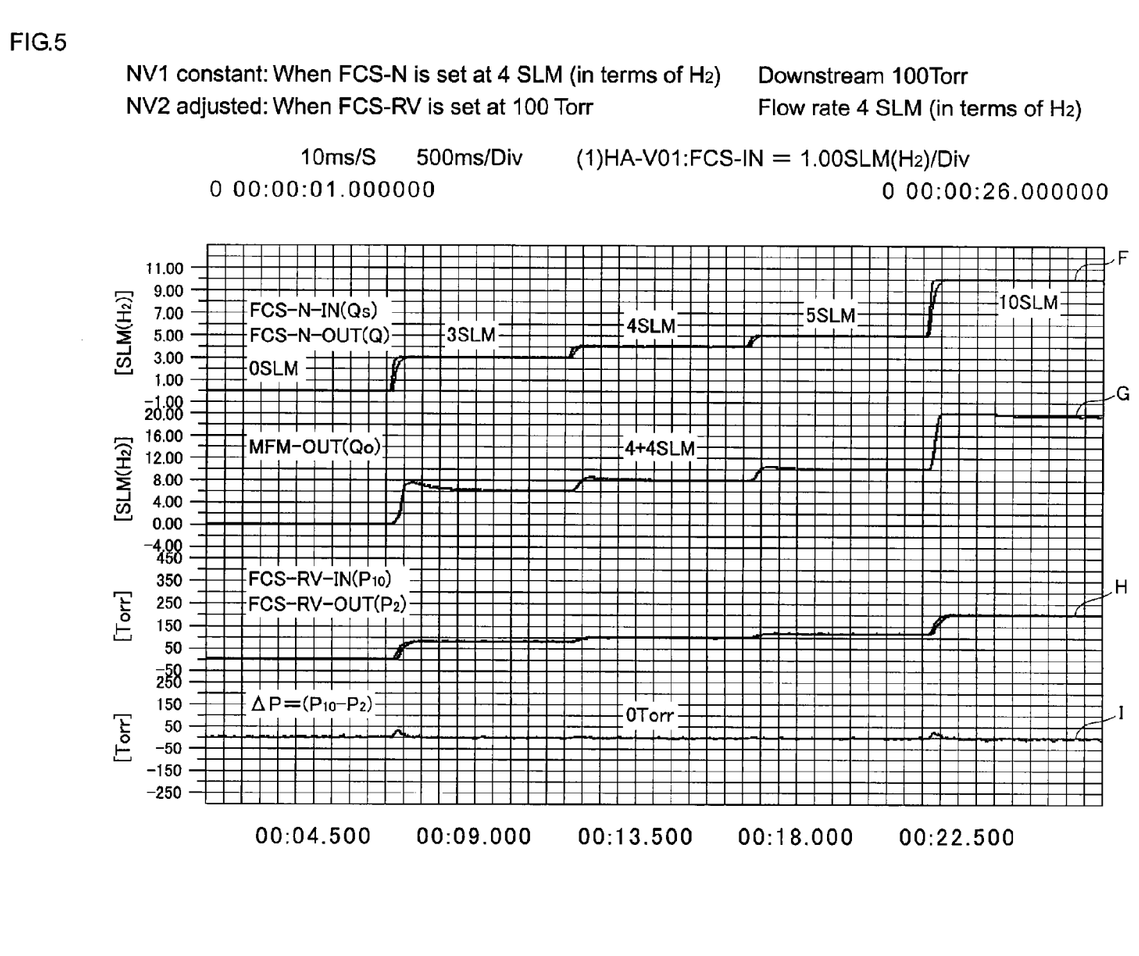
FIG. 5 is a diagram showing the same contents as FIG. 4, except under the conditions where the amount of exhaust gas of the vent gas supply line $L_2$ is set at 4 SLM (standard liter per minute) in the test of FIG. 4.
Figure 6:
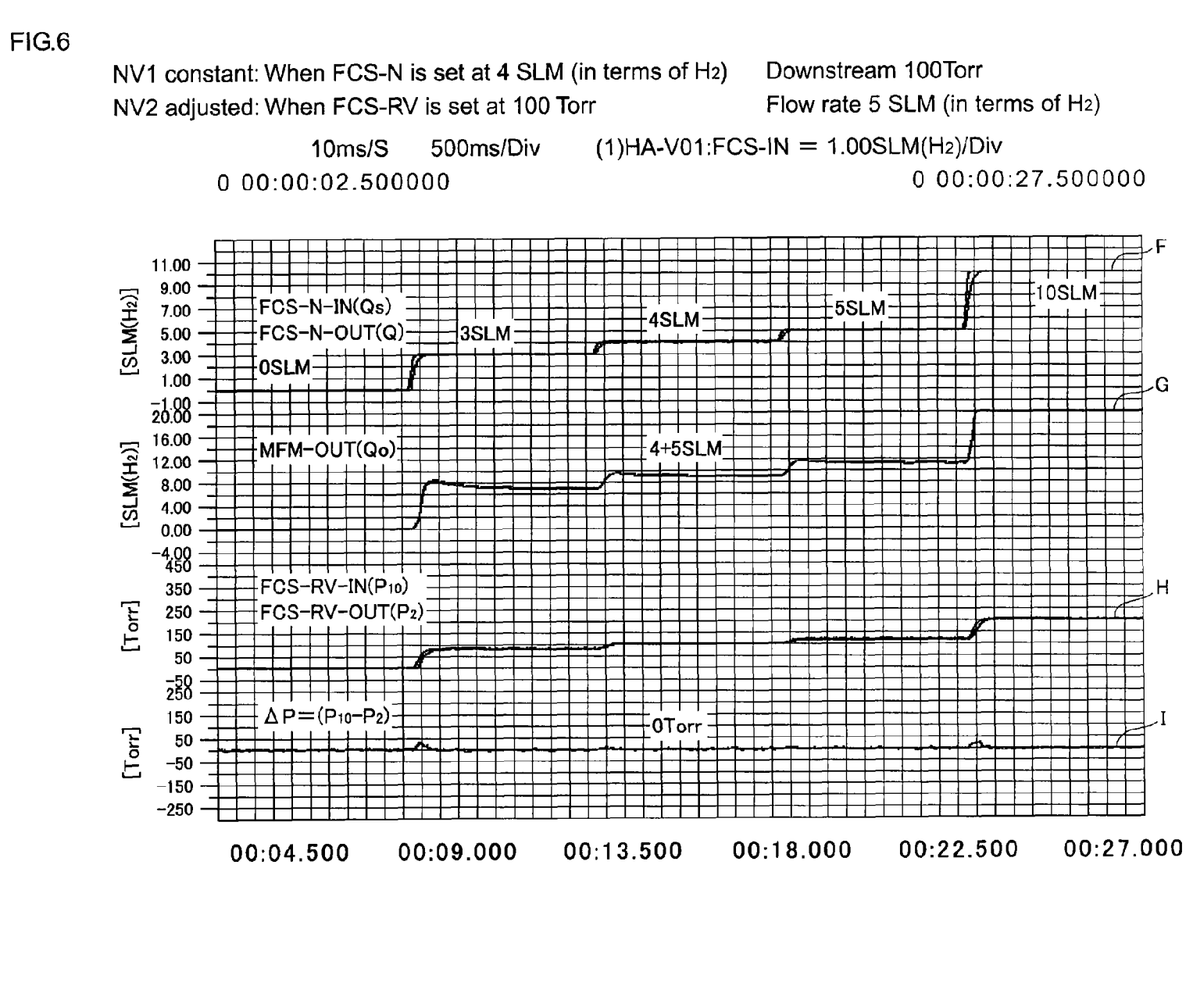
FIG. 6 is a diagram showing the same contents as FIG. 4, except under the conditions where the amount of exhaust gas of the vent gas supply line $L_2$ is set at 5 SLM in the test of FIG. 4.

FIG. 5 shows test results under the same condition as FIG. 4, except that the amount of exhaust gas of the evacuation pump $VP_2$ of the vent gas supply line $L_2$ is set at 3 SLM (in terms of $H_2$), and FIG. 6 shows test results under the same condition as FIG. 4 except that the amount of exhaust gas of the evacuation pump $VP_2$ is set at 5 SLM.

Experimental Result 2

Figure 7:
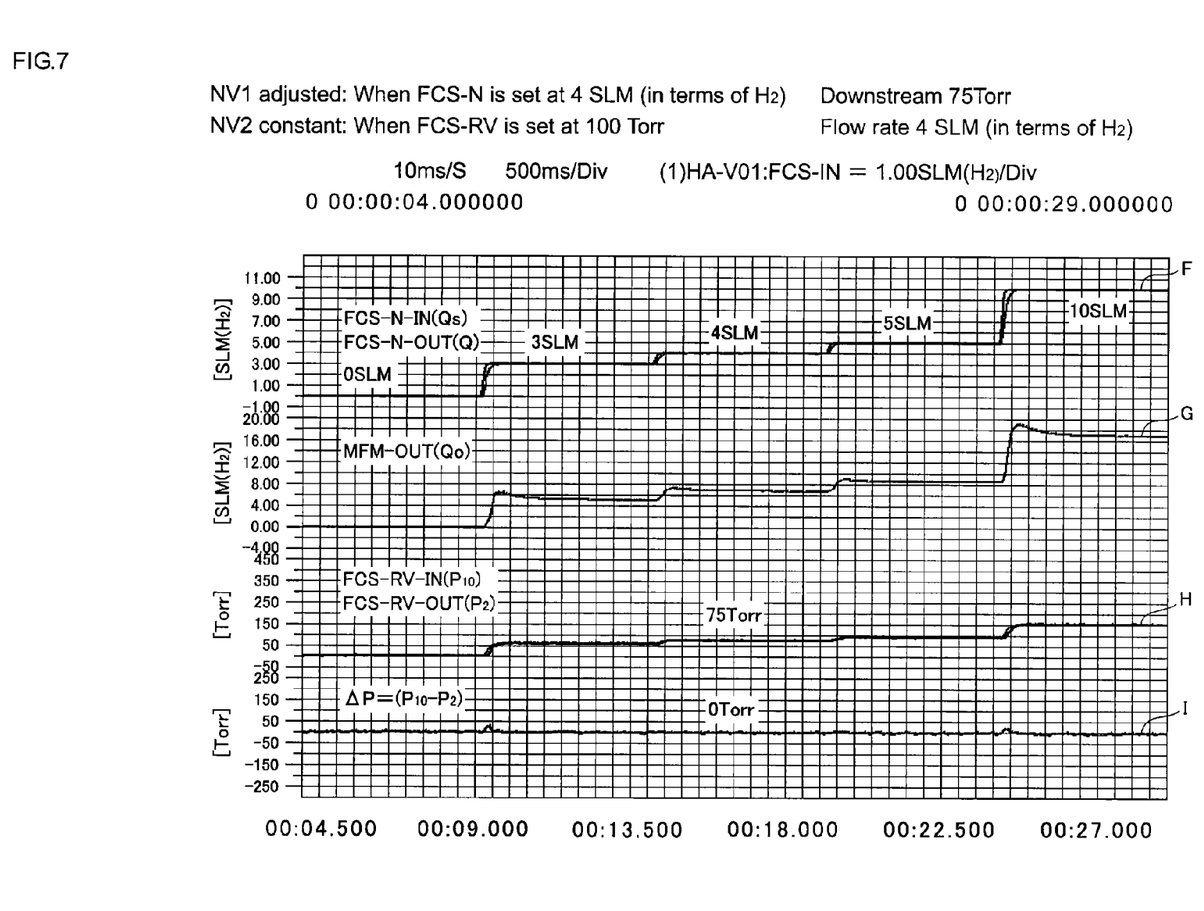
FIG. 7 is a diagram showing another example of the result of differential pressure regulation tests of the source gas supply system according to the present invention.

Next, the pressure regulating valve $NV_1$ was adjusted, and the pressure type flow-rate control system FCS-N was set at 4 SLM (in terms of $H_2$), and the exhaust pressure of the evacuation pump $VP_1$ was set at 75 Torr. Additionally, the pressure regulating valve $NV_2$ of the vent gas supply line $L_2$ was made constant, and the pressure controller FCS-RV was set at 100 Torr, and the amount of exhaust gas of the evacuation pump $VP_2$ was set at 4 SLM (in terms of $H_2$). FIG. 7 shows a changing situation of the same constituent, as in Experiment 1, when the flow rate set value Qs of the main gas supply line $L_1$ is changed in order of 0 SLM, 3 SLM, 4 SLM, 5 SLM, and 10 SLM from the above-mentioned state in the same way as in Experiment 1.

Figure 8:
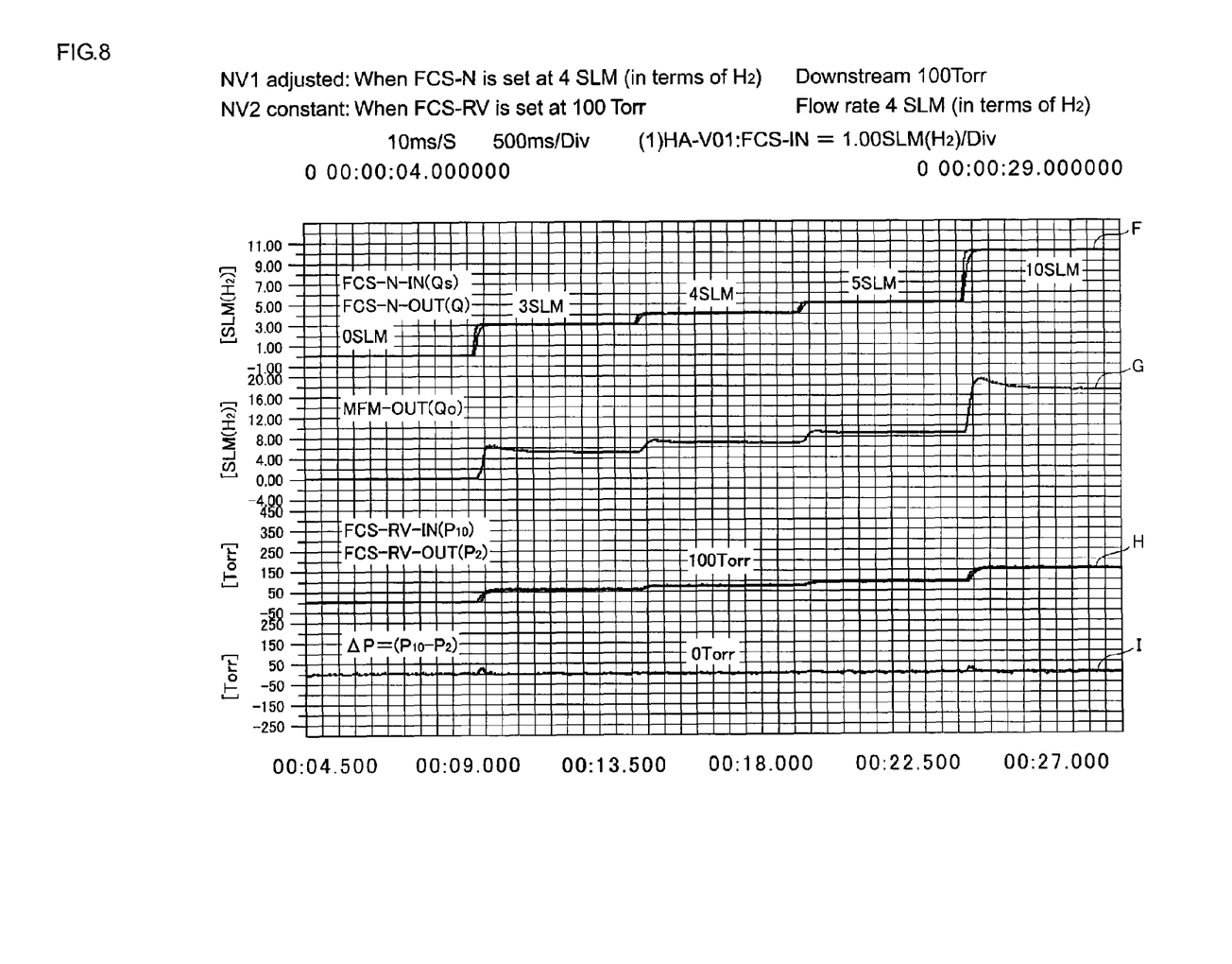
FIG. 8 is a diagram showing the same contents as FIG. 7, except under the conditions where the exhaust pressure of an evacuation pump $VP_1$ disposed on the side of the main gas supply line $L_1$ is set at 100 Torr.
Figure 9:
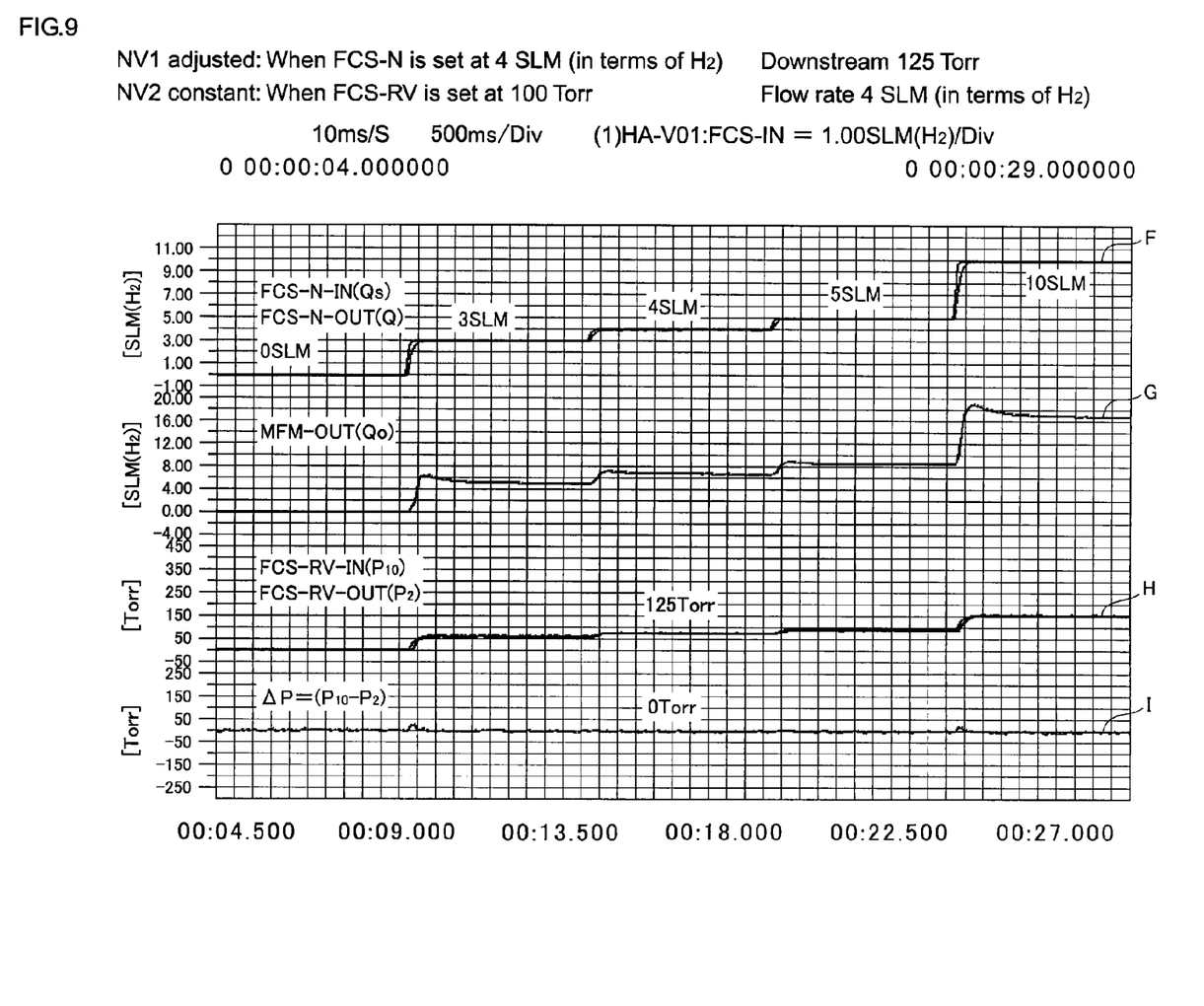
FIG. 9 is a diagram showing the same contents as FIG. 7, except under the conditions where the exhaust pressure of the evacuation pump $VP_1$ disposed on the side of the main gas supply line $L_1$ is set at 75 Torr.

FIG. 8 and FIG. 9 show the same value as in FIG. 7, except that the exhaust pressure of the evacuation pump $VP_1$ on the side of the main gas supply line $L_1$ is changed to 100 Torr and 125 Torr, respectively, compared to FIG. 7 wherein downstream pressure is 75 Torr.

As is apparent from FIG. 7 to FIG. 9, it is understood that the differential pressure $\Delta P$ between the lines $L_1$ and $L_2$ is kept at substantially zero when the amount of gas flow (i.e., flow rate) is changed even if the pressure value on the evacuation side of the main gas supply line $L_1$ varies.

INDUSTRIAL APPLICABILITY

The present invention is widely applicable not only to semiconductor manufacturing facilities adopting the MOCVD method, or the MOVPE method, but also to systems for adjusting and keeping a difference in gas pressure between a plurality of gas pipe lines disposed in parallel with each other at zero.

The invention claimed is:

1. A gas supply system for semiconductor manufacturing facilities employing a metal organic chemical vapor deposition method, wherein the gas supply system comprises:
   (a) a main gas supply line that supplies a source gas to a reactor;
   (b) a vent gas supply line disposed to evacuate the source gas;
   (c) a plurality of gas supply mechanisms disposed in a middle of both of the main gas supply line and the vent gas supply line;
   (d) a first pressure type flow-rate control system disposed on an inlet side of the main gas supply line, wherein the first pressure type flow-rate control system includes an orifice, and a predetermined amount of flow of a first carrier gas is supplied to the main gas supply line while the first pressure type flow-rate control system controls flow rate of the first carrier gas; and
   (e) a second pressure control system disposed on an inlet side of the vent gas supply line, wherein a second carrier gas having a predetermined pressure is supplied to the vent gas supply line while the second pressure control system performs a pressure adjustment, wherein a first gas pressure of the main gas supply line detected downstream from the orifice of the first pressure type flow-rate control system and a second gas pressure of the vent gas supply line are compared with each other, and the second gas pressure of the vent gas supply line is adjusted by the second pressure control system so that a difference between the first gas pressure and the second gas pressure becomes zero,
   wherein the first pressure type flow-rate control system disposed on the main gas supply line further comprises
   i. a first control valve provided with a first valve drive unit;
   ii. the orifice, wherein the orifice is disposed on a downstream side from the first control valve;
   iii. a first pressure detector disposed between the first control valve and an upstream side from the orifice;
   iv. a second pressure detector disposed on a downstream side from the orifice; and
   v. a first control circuit unit, wherein the first control circuit unit calculates a flow rate Q of gas flowing through the orifice based on a pressure signal sent from the first pressure detector, and the first control circuit unit calculates a difference Y between a set flow rate Qs input from an outside source and the flow rate Q calculated based on the pressure signal, and then the first control circuit unit inputs the difference Y to the first valve drive unit of the first control valve, and the first control circuit unit controllably opens or closes the first control valve in a direction in which the difference Y becomes zero; and
   the second pressure control system disposed on the vent gas supply line comprises
   i. a second control valve provided with a second valve drive unit;
   ii. a third pressure detector disposed on a downstream side therefrom; and
   iii. a second control circuit unit to which a detection pressure signal of the third pressure detector and a detection pressure signal of the second pressure detector disposed on the downstream side from the orifice of the first pressure type flow-rate control system are input, the second control circuit unit calculates a difference between the detection pressure signals and then inputs a signal X corresponding to the difference to the second valve drive unit, and the second control circuit unit controllably opens or closes the second control valve in a direction in which the difference X becomes zero, and a gas pressure of the vent gas supply line is adjustable so that the difference X in pressure between the main gas supply line and the vent gas supply line becomes zero.

2. The gas supply system for semiconductor manufacturing facilities according to claim 1, wherein the first pressure type flow-rate control system disposed on the main gas supply line is configured so that gas flow passes through the orifice under a critical state.

3. The gas supply system for semiconductor manufacturing facilities according to claim 1, wherein the detection pressure signal of the second pressure detector disposed downstream from the orifice of the first pressure type flow-rate control system of the main gas supply line is input to the second control circuit unit of the second pressure control system of the vent gas supply line before performing switching between gases supplied from any of the gas supply mechanisms, and the difference in pressure between the main gas supply line and the vent gas supply line is adjusted to become zero.

4. The gas supply system for semiconductor manufacturing facilities according to claim 1, wherein either the second pressure control system or the first pressure type flow-rate control system is provided with a display mechanism that displays the difference in pressure between the main gas supply line and the vent gas supply line.

* * * * *